United States Patent
Motz et al.

(10) Patent No.: US 11,329,657 B2
(45) Date of Patent: May 10, 2022

(54) SYNCHRONIZATION OF AN INTEGRATED CIRCUIT WITH A SENSOR

(71) Applicant: Infineon Technologies AG, Neubiberg (DE)

(72) Inventors: Mario Motz, Wernberg (AT); Veikko Summa, Villach (AT)

(73) Assignee: Infineon Technologies AG

( * ) Notice: Subject to any disclaimer, the term of this patent is extended or adjusted under 35 U.S.C. 154(b) by 208 days.

(21) Appl. No.: 16/778,612

(22) Filed: Jan. 31, 2020

(65) Prior Publication Data

US 2020/0252071 A1   Aug. 6, 2020

(30) Foreign Application Priority Data

Feb. 4, 2019 (DE) .......................... 102019201411.9

(51) Int. Cl.
| | |
|---|---|
| *H03L 7/099* | (2006.01) |
| *H03B 5/04* | (2006.01) |
| *H03B 5/32* | (2006.01) |
| *H03L 7/22* | (2006.01) |
| *H03L 7/18* | (2006.01) |
| *H03L 7/07* | (2006.01) |

(52) U.S. Cl.
CPC ............. *H03L 7/0992* (2013.01); *H03B 5/04* (2013.01); *H03B 5/32* (2013.01); *H03L 7/07* (2013.01); *H03L 7/18* (2013.01); *H03L 7/22* (2013.01)

(58) Field of Classification Search
CPC .... H03B 5/32; H03B 5/04; H03L 7/07; H03L 7/22; H03L 7/18; H03L 7/0992

USPC ........ 331/176, 1 A, 167, 111, 143; 455/260; 375/376; 327/156
See application file for complete search history.

(56) References Cited

U.S. PATENT DOCUMENTS

| | | | | |
|---|---|---|---|---|
| 7,555,275 | B2* | 6/2009 | Lang ........................ | H03C 1/62 375/345 |
| 7,907,019 | B1* | 3/2011 | Brown ................. | H04N 9/3194 331/18 |
| 8,049,569 | B1* | 11/2011 | Wright .................... | H03L 7/104 331/44 |
| 9,335,396 | B2* | 5/2016 | Debeurre ............. | G01R 35/005 |
| 10,256,801 | B2* | 4/2019 | Hsu ........................... | G06F 1/06 |
| 10,750,452 | B2* | 8/2020 | Agarwal ................ | H04W 4/38 |
| 2010/0315137 | A1 | 12/2010 | Kimura | |

(Continued)

FOREIGN PATENT DOCUMENTS

WO    WO-2015049479 A1 * 4/2015 .......... H04L 7/0331

*Primary Examiner* — Arnold M Kinkead

(74) *Attorney, Agent, or Firm* — Design IP

(57) ABSTRACT

An integrated circuit has an oscillator circuit having an on-chip oscillator, a digital phase locked loop and a sensor. A frequency of an output signal from the oscillator circuit is adjustable. The digital phase locked loop receives the output signal from the oscillator circuit at an input and a synchronization signal based on an output signal from an external precision oscillator in the form of a crystal oscillator or MEMS oscillator at an external interface and generates a control signal in order to synchronize the frequency of the oscillator circuit with the frequency of the external crystal oscillator. The sensor is designed to measure at least one environmental parameter, wherein the digital phase locked loop is designed to take into account the at least one measured environmental parameter when generating the control signal.

25 Claims, 5 Drawing Sheets

(56) References Cited

U.S. PATENT DOCUMENTS

2011/0018646 A1    1/2011   Lee et al.
2012/0313676 A1   12/2012   Nguyen et al.

\* cited by examiner

SYNCHRONIZATION OF AN INTEGRATED CIRCUIT WITH A SENSOR

FIELD

Examples of the present disclosure relate to the field of integrated circuits and, in particular, integrated circuits having sensors for capturing environmental parameters.

BACKGROUND

Integrated circuits having an on-chip sensor can also be referred to as integrated sensor circuits. Integrated sensor circuits can be used in communication networks in order to capture environmental parameters and/or other variables, for example an angle or a current, and to output them to an external controller. In order to enable communication with an external communication partner, digital high-speed interfaces for sensors are intended to have a stable frequency. For example, digital high-speed interfaces for sensors in the automotive sector require a very stable oscillator in order to recognize signal patterns on digital high-speed interfaces. In this case, a stable frequency is required for a wide temperature range and severe humidity fluctuations which can cause mechanical stress in plastic housings. Furthermore, a high stability, which is not limited by electrical aging effects, should be possible over the service life of the integrated circuit.

Crystal oscillators can be used to implement oscillators having a stable frequency. Crystal oscillators can provide a very stable oscillator frequency. However, crystal oscillators cannot be implemented on chip, with the result that an additional pin, a connection pin, and wiring from the crystal oscillator to the sensor chip are required. This results in additional costs and an additional space requirement which is often not available in many sensor applications.

SUMMARY

Integrated sensor circuits which enable communication at a stable frequency without the need for a crystal oscillator which cannot be concomitantly integrated would be desirable.

Examples of the present disclosure provide an integrated circuit having the following features:
an oscillator circuit having an on-chip oscillator, wherein a frequency of an output signal from the oscillator circuit is adjustable;
a digital phase locked loop having an input, an external interface and an output, wherein the digital phase locked loop is designed to receive the output signal from the oscillator circuit at the input, to receive a synchronization signal based on an output signal from an external precision oscillator in the form of a crystal oscillator or MEMS oscillator at the external interface and to generate a control signal at the output and to output it to the oscillator circuit in order to synchronize the frequency of the oscillator circuit with the frequency of the external precision oscillator; and
a sensor which is designed to measure at least one environmental parameter, wherein the digital phase locked loop is designed to take into account the at least one measured environmental parameter when generating the control signal.

Examples of the present disclosure provide a sensor system including such an integrated circuit and an external controller which is designed to output the synchronization signal to the integrated circuit.

Examples of the present disclosure provide a controller having the following features:
an interface which is designed to receive sensor signals from an external integrated circuit with a first regularity and to output synchronization signals based on an output signal from a precision oscillator in the form of a crystal oscillator or MEMS oscillator to the external integrated circuit; and
a processing circuit which is designed to output the synchronization signals to the external integrated circuit according to a synchronization protocol, wherein the synchronization protocol specifies that the synchronization signal is transmitted to the integrated circuit with a second regularity which is lower than the first regularity, wherein a ratio of the first regularity to the second regularity is at least 10:1, at least 50:1 or at least 100:1.

Examples of the present disclosure provide a method for synchronizing an oscillator circuit of an integrated circuit which has an oscillator circuit of adjustable frequency, a digital phase locked loop and a sensor for measuring an environmental parameter, wherein the oscillator circuit has an on-chip oscillator, having the following features:
receiving a synchronization signal based on an output signal from an external precision oscillator in the form of a crystal oscillator or MEMS oscillator from an external controller;
receiving an output signal from the oscillator circuit;
using the digital phase locked loop to generate a control signal using the synchronization signal and the output signal from the oscillator circuit; and
applying the control signal to the oscillator circuit in order to synchronize the frequency of the oscillator circuit with the frequency of the external precision oscillator.

In examples of the present disclosure, an on-chip oscillator is therefore used in an integrated circuit, the frequency of which oscillator is synchronized with the frequency of an external precision oscillator using a synchronization signal. The digital phase locked loop is designed to take into account one or more environmental parameters captured by one or more sensors of the integrated circuit in order to compensate for a dependence of the frequency of the oscillator circuit on the environmental parameter, for example temperature and/or stress. The phase locked loop can also be designed to take into account process variations in the production of the integrated circuit in order to compensate for a dependence of the frequency of the oscillator circuit on such process variations. Furthermore, aging effects of the on-chip oscillator, which would otherwise impair the accuracy of the frequency of the oscillator circuit, can be reduced or compensated for by using the synchronization signal which is based on the output signal from an external precision oscillator. Examples of the present disclosure therefore make it possible to implement a cost-effective and space-saving on-chip oscillator, which can achieve crystal accuracy, integrated in an integrated circuit.

In examples of the present disclosure, an external controller is designed to output synchronization signals to the integrated circuit, wherein a regularity with which the synchronization signals are output to the integrated circuit is lower than a regularity with which sensor signals are transmitted from the integrated circuit to the external controller. In examples, synchronization signals are therefore transmitted with a low regularity, with the result that other communication operations via the interfaces used to transmit the synchronization signals are not excessively impaired.

BRIEF DESCRIPTION OF THE DRAWINGS

Examples of the disclosure are described below with reference to the accompanying drawings, in which.

DETAILED DESCRIPTION

Examples of the present disclosure are detailed below and are described using the accompanying descriptions. It is pointed out that identical elements or elements having the same functionality can be provided with identical or similar reference signs, in which case a repeated description of elements which are provided with the same or similar reference signs is typically omitted. Descriptions of elements which have identical or similar reference signs are interchangeable. Many details are described in the following description in order to provide a more in-depth explanation of examples of the disclosure. However, it is clear to experts that other examples can be implemented without these specific details. Features of the different examples described can be combined with one another unless features of a corresponding combination exclude one another or such a combination is expressly excluded.

Figure 1:
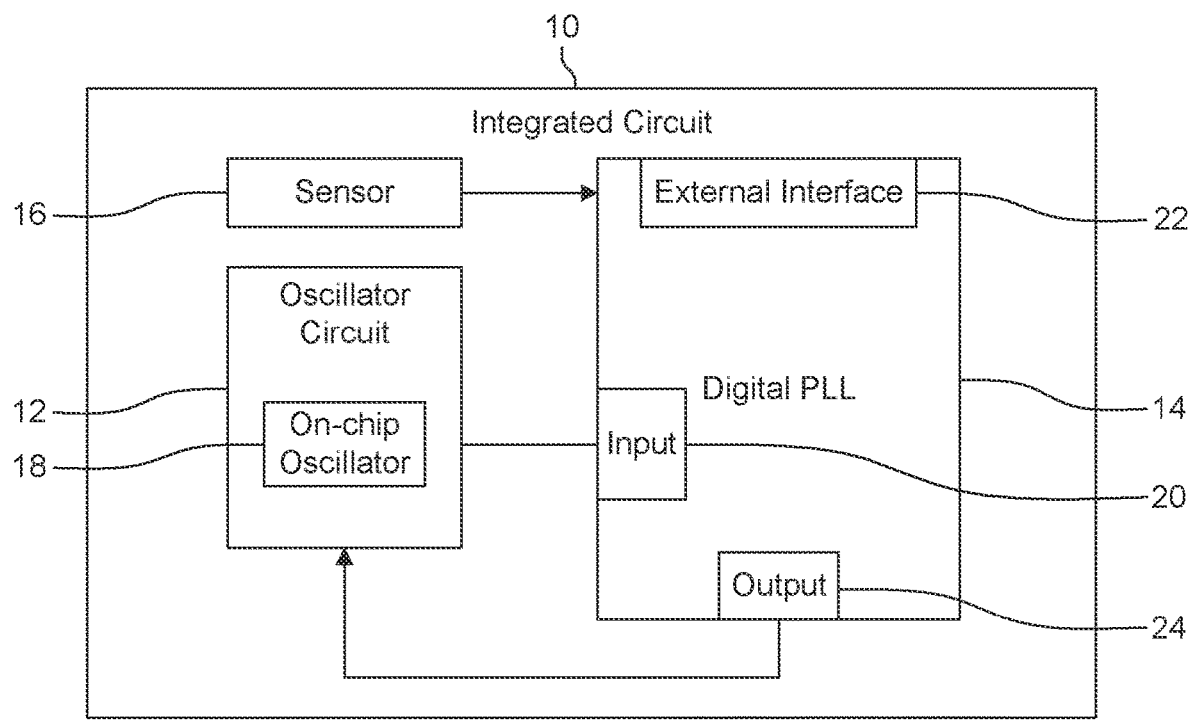
FIG. 1 shows a schematic illustration of an example of an integrated circuit.

FIG. 1 schematically shows an integrated circuit 10 having an oscillator circuit 12, a digital phase locked loop 14 and a sensor 16. In examples, the integrated circuit 10 is a monolithically integrated circuit, the components of which are monolithically integrated on a chip. The oscillator circuit 12 has an on-chip oscillator 18. In this case, an on-chip oscillator should be understood as meaning an oscillator which is monolithically integrated on the chip of the integrated circuit. The digital phase locked loop 14 has an input 20, an external interface 22 and an output 24. The input 20 is connected to an output of the oscillator circuit 12 in order to receive an output signal from the oscillator circuit 12. The output 24 is connected to a control input of the oscillator circuit 12 in order to output a control signal to the oscillator circuit 12 in order to adjust the frequency of the oscillator circuit. The digital phase locked loop 14 may be part of a digital processing circuit, and the external interface 22 may be an external interface of the digital processing circuit. The digital phase locked loop 14 is designed to receive a synchronization signal at the external interface 22. The digital phase locked loop 14 is also designed to generate the control signal at the output 24 on the basis of a comparison of the synchronization signal with the output signal from the oscillator circuit 12, in order to synchronize the frequency of the output signal from the oscillator circuit 12 with a frequency of an external precision oscillator, on the output signal from which the synchronization signal is based. The digital phase locked loop 14 is also designed to take into account at least one environmental parameter measured by the sensor 16 when generating the control signal.

In this case, an external interface is understood as meaning an interface which is used to receive a signal from a circuit which is external to the integrated circuit. In this case, the interface may be a wireless interface or a wired interface.

In examples, the on-chip oscillator is a relaxation oscillator or an LC oscillator. Such an oscillator can be readily implemented on chip, with the result that there is no need for an external chip with a pin and wiring.

In examples, the oscillator circuit 12 has a frequency multiplier which is coupled to an output of the on-chip oscillator and is designed to output the output signal from the oscillator circuit at its output. The stability of the output frequency of an on-chip oscillator, for example of a relaxation oscillator or an LC oscillator, can decrease with increasing output frequency. As a result of the use of a frequency multiplier, examples make it possible to use an on-chip oscillator with a lower output frequency since an output signal having a higher frequency can be generated by the frequency multiplier. In examples, the frequency multiplier has an analog phase locked loop.

In examples, the synchronization signal has a pattern of a predetermined duration, wherein the digital phase locked loop 14 is designed to count a number of oscillations in the output signal from the oscillator circuit 12 during the predetermined duration and to generate the control signal on the basis of the result in order to bring the number to a predetermined value. In examples, the synchronization signal has a predetermined frequency, and the digital phase locked loop 14 is designed to adjust the frequency of the oscillator circuit to the predetermined frequency.

In examples, the integrated circuit 10 has a memory which stores compensation parameters, wherein the memory is accessed using the at least one measured environmental parameter in order to obtain at least one compensation parameter which is taken into account when generating the control signal. In examples, respective compensation parameters which were obtained in advance, for example during calibration of the integrated circuit, are assigned to respective environmental parameters in the memory. In this case, the compensation parameters are designed to obtain a stable constant output frequency of the oscillator circuit for different environmental parameters. In examples, the environmental parameter is the temperature and/or a stress, that is to say a mechanical load, which act(s) on the integrated circuit. In examples, the integrated circuit therefore has a temperature sensor and/or a stress sensor.

In examples, the digital phase locked loop is also designed to take into account compensation parameters for taking into account process variations in the production of the integrated circuit when generating the control signal. The corresponding compensation parameter(s) can likewise be stored in a memory of the integrated circuit.

Examples of the present disclosure therefore make it possible to adjust the output frequency of the oscillator circuit on the basis of one or more captured environmental parameters and/or process variations in order to obtain a stable output frequency.

In examples, the oscillator of the on-chip oscillator circuit has an adjustable resistance, an adjustable capacitance, an adjustable comparator reference voltage and/or an adjustable current. In examples, the digital phase locked loop is designed to adjust at least one of these parameters in order to adjust the output frequency of the oscillator circuit. In examples in which the oscillator circuit has a frequency multiplier in the form of an analog phase locked loop, the digital phase locked loop can be designed to adjust a divider ratio of a frequency divider in a feedback path of the analog phase locked loop in order to adjust the output frequency of the oscillator circuit.

Figure 2:
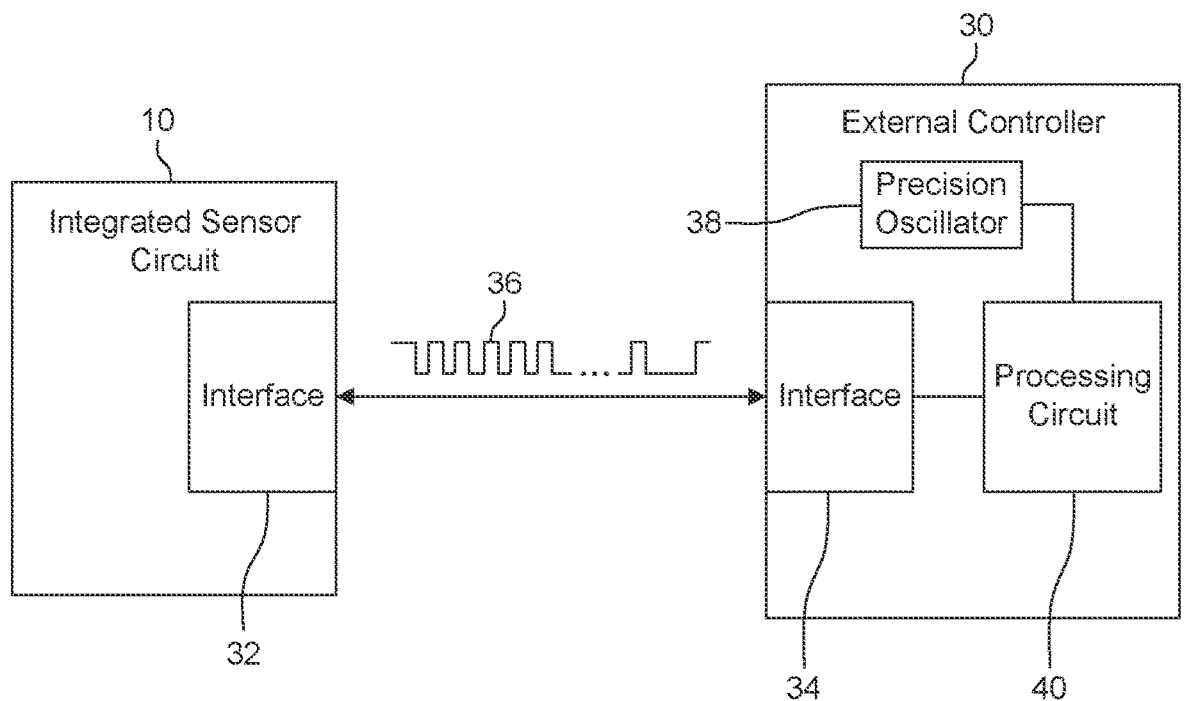
FIG. 2 shows a schematic illustration of an example of a sensor system.

FIG. 2 schematically shows a sensor system having an integrated sensor circuit 10 and an external controller 30. Although only one integrated sensor circuit 10 is shown in FIG. 2, a plurality of integrated sensor circuits can be coupled to the external controller 30 in examples. The external controller 30 may be, for example, an electronic control unit, ECU, of a motor vehicle. The integrated sensor circuit 10 has an interface 32 and the external controller 30 has an interface 34. The interfaces 32, 34 may be interfaces for a wired or wireless connection. In examples, the interfaces 32, 34 may be UART interfaces, UART= Universal Asynchronous Receiver Transmitter. In other examples, the interfaces may be Bluetooth interfaces. The interfaces 32, 34 can be connected to one another via a bus system. The integrated sensor circuit 10 and the external controller 30 communicate via the interfaces 32, 34, wherein the data signals 36 transmitted in this case are generated using a respective clock. In this case, the external controller 30 uses a clock which is generated by a precision oscillator 38 of the external controller 30. In this case, the integrated sensor circuit 10 uses a clock which is generated by the oscillator circuit 12. The precision oscillator 38 is formed by a crystal oscillator or a micro-electromechanical system (MEMS) oscillator. A precision oscillator should be understood as meaning an oscillator, the output frequency of which has a greater stability with respect to temperature, stress, aging effects and process variations than that of an on-chip oscillator.

The sensor circuit 10 is designed to output sensor signals to the external controller 30 via the interface 32, and the external controller 30 is designed to receive the sensor signals via the interface 34. The external controller 30 has a processing circuit 40 which can be designed to process the sensor signals and to control other apparatuses, for example actuators, on the basis of the sensor signals. In examples, the controller can be designed to control components of a motor vehicle on the basis of the sensor signals. The sensor signals may be the output signals from the sensor(s) 16 in this case. In examples, the sensor circuit may have one or more further sensors in order to capture other variables, for example an angle sensor or a current sensor. The sensor circuit can be designed to output signals from this/these further sensor(s) to the external controller 30 via the interface.

The processing circuit 40 is designed to generate a synchronization signal on the basis of the output signal from the precision oscillator 38 and to output the synchronization signal to the integrated sensor circuit 10 via the interface 34. The interface 32 receives the synchronization signal. The interface 32 can correspond to the interface 22 of the digital phase locked loop or can be coupled thereto. The external controller 30 can be designed to output the synchronization signal as part of a synchronization protocol, wherein the synchronization protocol specifies that the synchronization signal is transmitted to the integrated circuit 10 periodically with a particular regularity and/or in each case after the integrated circuit 10 has been switched on. In examples, the regularity with which sensor signals are transmitted from the integrated circuit 10 to the external controller 30 may be higher or much higher than the regularity with which the synchronization signal is transmitted from the external controller 30 to the integrated circuit 10. In examples, the ratio may be at least 10:1, at least 50:1 or at least 100:1. In examples, the synchronization signal, on the basis of which aging effects of the oscillator circuit 12 of the integrated circuit 10 can be compensated for, is therefore transmitted with a very low regularity, with the result that other communication operations via the interfaces 32, 34 are impaired only to a slight extent. This can be advantageous, in particular, when the interfaces 32, 34 are connected to one another via a bus system and the bus system connects the external controller to a multiplicity of sensor circuits and actuators.

Examples of the present disclosure therefore make it possible to implement sensor chips or integrated sensor circuits and associated sensor interfaces with on-chip oscillators. Examples enable a stable output frequency of the oscillator circuit by means of temperature compensation, by compensating for aging effects caused by mechanical stress and by compensating for aging effects caused by electrical effects of integrated components, for example resistors and transistors. The last-mentioned aging effects can be compensated for by using the synchronization signal which is based on the output signal from an external precision oscillator.

Examples therefore enable a temperature-compensated and stress-compensated on-chip oscillator, for example a relaxation oscillator, with a small chip area, a high degree of accuracy, a low temperature drift and a low aging drift. The on-chip oscillator of the sensor circuit can initially provide an accurate oscillator frequency, for example of several 10 MHz. From time to time, an external controller, for example an external microprocessor, µP, can output an external synchronization pattern, a synchronization signal based on its own crystal oscillator, XTAL oscillator (XTAL=crystal), to the sensor circuit. In this case, a longer period of hours or days may be between the individual synchronization signals. A digital phase locked loop in the sensor circuit can recognize the synchronization pattern, for example, and can measure the length of the synchronization pattern received from the external microprocessor. This measurement can be carried out at the output frequency of the oscillator circuit of the sensor circuit. In examples, this is the output frequency of an analog phase locked loop of the oscillator circuit. The digital phase locked loop can then adjust the oscillator circuit to a more accurate frequency, that is to say a frequency which is closer to the frequency of the crystal oscillator of the microprocessor. Since this is carried out on the basis of the synchronization signal transmitted to the sensor circuit, this accuracy can be achieved over a long period, for example several years.

Figure 3:
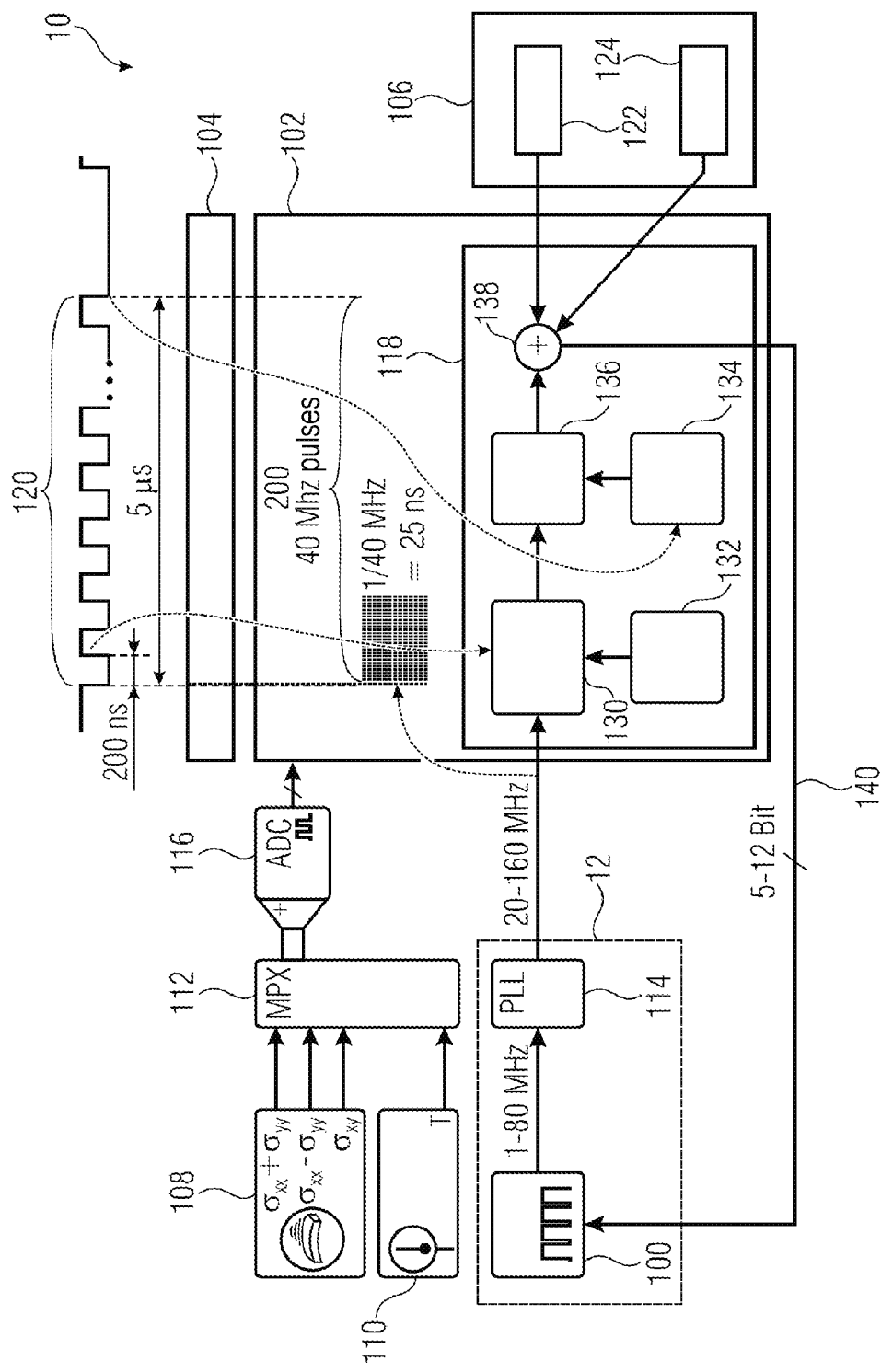
FIG. 3 shows a schematic illustration of an example of an integrated sensor circuit showing details of a digital processing circuit.

FIG. 3 shows an example of a sensor circuit 10 having an on-chip oscillator 100 in the form of a relaxation oscillator. In other examples, the on-chip oscillator can be formed by an LC oscillator. The sensor circuit 10 has a digital signal processing circuit 102, an interface 104, a memory 106, stress sensors 108, a temperature sensor 110, a multiplexer 112, an analog phase locked loop 114 and an analog/digital converter 116. The digital signal processing circuit 102 has a digital phase locked loop 118. The output signal from the on-chip oscillator may have a frequency of 1-80 MHz, for example. The output signal from the analog phase locked loop 114 may have a frequency of 20-160 MHz, for example.

Relaxation oscillators, in particular RC relaxation oscillators, and LC oscillators, in particular in the range of 100 MHz to GHz, can be readily monolithically integrated on chip because components, such as inductances and capacitances, are small enough to be able to be concomitantly integrated.

The analog phase locked loop 114 is an example of a frequency multiplier. In other examples, a frequency multiplier can be implemented in another manner. The frequency multiplier is optional and, in other examples, the output of the on-chip oscillator 100 can be directly connected to the digital phase locked loop 118. The on-chip oscillator 100 and the analog phase locked loop 114 constitute an oscillator circuit 12.

The sensors 108, 110 are coupled to the analog/digital converter 116 via the multiplexer 112. An output of the analog/digital converter is connected to an input of the digital signal processing circuit 102. An output of the on-chip oscillator 100 is connected to an input of the analog phase locked loop 114 and an output of the analog phase locked loop 114 is connected to an input of the digital phase locked loop 118. The digital phase locked loop 118 is coupled to the memory 106 which stores stress and temperature compensation parameters 122 and process variation compensation parameters 124. For example, n bits of stress and temperature compensation parameters 122, where n may be five, and m bits of process variation compensation parameters, where m can be 6 to 8, can be stored in the memory 106. The interface 104 is connected to the digital signal processing circuit 102 and to the digital phase locked loop 118. The interface 104 can be considered to be an external interface of the digital phase locked loop 118.

An external synchronization signal is illustrated at 120 in FIG. 3. In the example shown, the synchronization signal consists of a pattern of regular pulses which has a predetermined duration. In the example shown, the pattern has a duration of 5 μs, wherein each pulse has a pulse duration of 200 ns. In the example shown, the synchronization signal therefore has two hundred 40 MHz pulses. There is no need to separately mention that other synchronization signals can be used in other examples as long as the synchronization signal and the duration and/or frequency thereof can be recognized by the digital phase locked loop 118 or the digital signal processing circuit 102.

The digital phase locked loop 118 has a counter 130, a starting value memory 132, a pattern recognition circuit 134, a logic unit 136 and an adder 138. The counter 130 is designed to begin to count pulses, that is to say oscillations, in the output signal from the analog phase locked loop 114 in response to the occurrence of a first edge in a signal applied to the interface 104. In the exemplary embodiment shown, the counting begins at a starting value stored in the starting value memory 132. In the example shown, the starting value can be −200. The pattern recognition circuit 134 is designed to recognize the pattern of the synchronization signal 120. The logic unit 136 is designed to track and store the count value from the counter 130. The pattern recognition circuit 134 recognizes the pattern of the synchronization signal at the end of the latter and indicates this to the logic unit 136 which, at this time, stores the number of pulses of the output signal from the analog phase locked loop 114 which were counted during the synchronization signal.

The digital phase locked loop adjusts a control signal at the output of the logic unit 136 in such a manner that the number of oscillations counted during the synchronization 120 is regulated to a predetermined number. As a result, the frequency of the output signal from the oscillator circuit 12 is synchronized with the frequency of the external crystal oscillator, on the output signal from which the synchronization signal 120 is based.

As explained below, the digital phase locked loop 118 takes into account at least one environmental parameter measured by the sensor(s) 108, 110. The mechanical stress sensor(s) 108 can be designed to capture mechanical loads, to which the sensor circuit 10 is exposed, in different directions. By way of example, stresses $\sigma_{xx}+\sigma_{yy}$, $\sigma_{xx}-\sigma_{yy}$ and $\sigma_{xy}$ are indicated in FIG. 3. The temperature sensor 110 is designed to capture a temperature T to which the integrated sensor circuit is exposed. Analog sensor signals from the sensors 108 and 110 are supplied, via the multiplexer 112, to the analog/digital converter and converted there into digital signals which are output to the digital signal processing circuit 102. The digital signal processing circuit 102 or the digital phase locked loop 118 accesses the stress and temperature compensation parameters 122 in the memory 106 using the sensor signals and recovers compensation parameters associated with the sensor signals. The recovered compensation parameters are taken into account by adding them to the control signal in the adder 138. The digital phase locked loop is also designed to take into account the process variation compensation parameter 124 stored in the memory 106 when generating the control signal. This parameter can in turn be added to the control signal in the adder. The control signal 140 generated in this manner is output to the oscillator circuit 12 in order to adjust the frequency of the output signal from the latter. In this case, the control signal may be digital and may have a width of 5-12 bits. A circuit parameter of the oscillator circuit 12 can be changed using the control signal in order to change the frequency of the output signal from the oscillator circuit 12 and to synchronize it with the desired frequency.

Examples of the present disclosure therefore provide a sensor having an on-chip oscillator which has a temperature compensation circuit, a stress compensation circuit and a process variation compensation circuit. A digital phase locked loop is also provided in order to synchronize with an external initial pattern or synchronization signal via an interface. Examples of the present disclosure therefore enable an accurate oscillator frequency over time, that is to say the service life, and the temperature, without a complicated crystal oscillator in the sensor apparatus and without an additional pin for a connection to the crystal oscillator on the sensor apparatus.

In examples, radio-frequency patterns are transmitted and recognized, for example via a 12-bit UART interface in the range of several microseconds, for synchronization purposes.

In the example shown in FIG. 3, the blocks 100, 108, 110, 112 and 114 can be implemented as analog circuit structures. The input of the block 116 is analog and the output of said block is digital. The blocks 102, 104 and 106 can be implemented by means of digital circuit structures.

Figure 4:
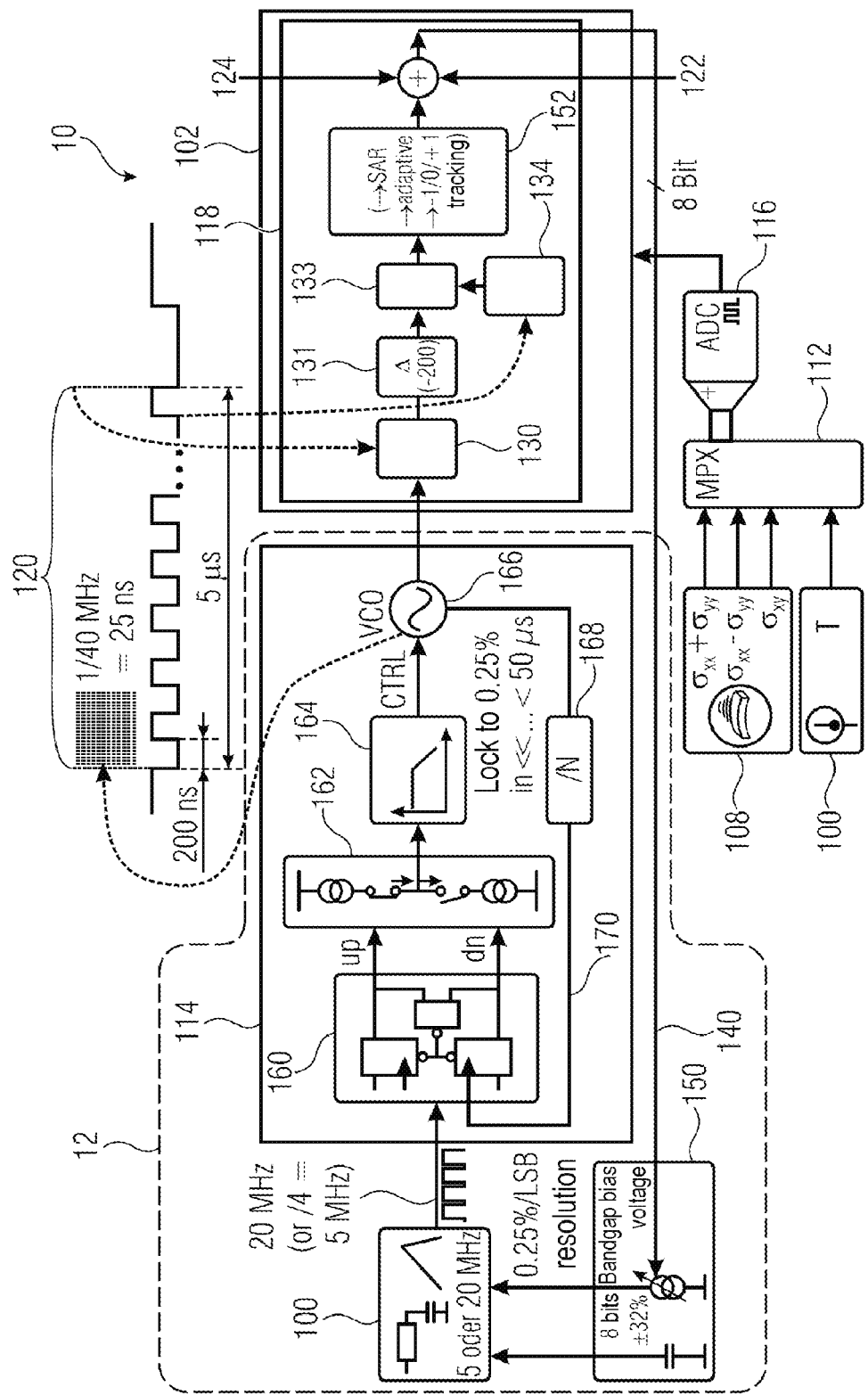
FIG. 4 shows a schematic illustration of an example of an integrated sensor circuit showing details of an analog phase locked loop.

FIG. 4 schematically shows an example of a sensor circuit 10 having a digital signal processing circuit 102 with a digital phase locked loop 118, an RC relaxation oscillator 140 with a supply circuit 150, an analog phase locked loop 114, stress sensors 108, a temperature sensor 100, a multiplexer 112 and an analog/digital converter 116. Elements having the same functionality as corresponding elements in FIG. 3 are provided with the same or similar reference signs, in which case reference is made to the above description of FIG. 3 with regard to the description of this functionality.

The digital signal processing circuit 102 again has an interface, not shown in FIG. 4, via which an initial pattern, that is to say a synchronization signal 120, is received. In the present case, the counter 130 again counts beginning with a first edge of a signal received via the interface. A respective difference Δ between the count value and a predetermined count value is determined in a block 131 and is buffered in a latch block 133. As soon as the pattern recognition block 134 has recognized the initial pattern or synchronization signal, digital readjustment of the output frequency of the analog phase locked loop 114 is implemented by means of a tracking logic unit 152 of the digital phase locked loop 118 using the value Δ buffered at this time. Any desired suitable successive approximation algorithms, adaptive algorithms or −1/0/+1 algorithms can be implemented for this purpose. Corresponding algorithms can also be used in the example shown in FIG. 3. The digital phase locked loop 118 can therefore be designed to capture and correct a difference between a count value and a predetermined count value.

As is also shown in FIG. 4, the digital phase locked loop 118 again receives process variation compensation parameters 124 and stress and temperature compensation parameters 122. These can again be stored in a memory, as described above with reference to FIG. 3, and can be recovered using sensor signals measured by the sensors 110 and 108. The digital phase locked loop 118 again provides the control signal 140 which is returned to the oscillator circuit 12 of the sensor circuit 10.

The oscillator circuit 12 has the RC relaxation oscillator, the supply circuit 150 illustrated separately in FIG. 4 and the analog phase locked loop 114. The supply circuit 150 may have a bandgap bias circuit for providing a current for the RC relaxation oscillator and a voltage source for providing a comparator reference voltage for the RC relaxation oscillator, as indicated in FIG. 4. Circuit parameters of the RC relaxation oscillator and/or of the supply circuit, which can be considered to be a part of the RC relaxation oscillator, can be adjusted using the control signal 140 in order to adjust the frequency of the output signal from the RC relaxation oscillator. In examples, the control signal 140, which constitutes a feedback signal, can be a digital signal. In examples, the control signal can have a width of 8 bits. A digital/analog converter (not shown) can be provided for the purpose of converting the digital control signal into an analog signal before it is applied to the component(s) of the RC relaxation oscillator which is/are to be controlled. In examples, one or more of the following circuit parameters can be adjusted by means of the control signal 140: resistance and/or capacitance of the RC relaxation oscillator 100, a current of the RC relaxation oscillator and a comparator reference voltage of the RC relaxation oscillator. The current may be a bandgap bias current, a reference current or an integrator current of the RC relaxation oscillator.

The output signal from the RC relaxation oscillator may have, for example, a frequency of 20 MHz or of 20 MHz divided by 4, that is to say 5 MHz. As described above, the exact frequency can be adjusted by adjusting one or more of the circuit parameters of the RC relaxation oscillator. The output signal from the RC relaxation oscillator 100 is again supplied to the analog phase locked loop 114. The analog phase locked loop 114 may have a phase/frequency detector 160, a charge pump 162, a loop filter 164, a voltage-controlled oscillator, VCO, 166 and a frequency divider 168. The frequency divider may be a fractional frequency divider. A fractional frequency divider can switch the divider ratio back and forth in order to obtain, on average, a higher-resolution frequency divider ratio than is possible using integer divider ratios. The phase/frequency detector 160 carries out a phase comparison between the output signal from the RC relaxation oscillator 100 and a feedback signal 170 of the analog phase locked loop 114. Depending on the result of the comparison, the phase/frequency detector 160 activates a control signal up or a control signal dn. Depending on which control signal is active, a VCO control signal is adjusted by the charge pump 162. The output signal from the charge pump 162 is applied to the control input of the VCO 166 via the loop filter 164. The feedback signal 170 is generated by passing the output signal from the VCO 166 through the frequency divider 168. The frequency divider carries out a frequency division by N.

The frequency of the output signal from the analog phase locked loop 114 can therefore be a multiple of the frequency of the output signal from the RC relaxation oscillator 100. In examples, the frequency of the output signal from the analog phase locked loop 114 may be 40 MHz or 80 MHz. The output signal from the analog phase locked loop 114 is again supplied to the digital phase locked loop 118, as explained above with reference to FIG. 3.

Figure 5:
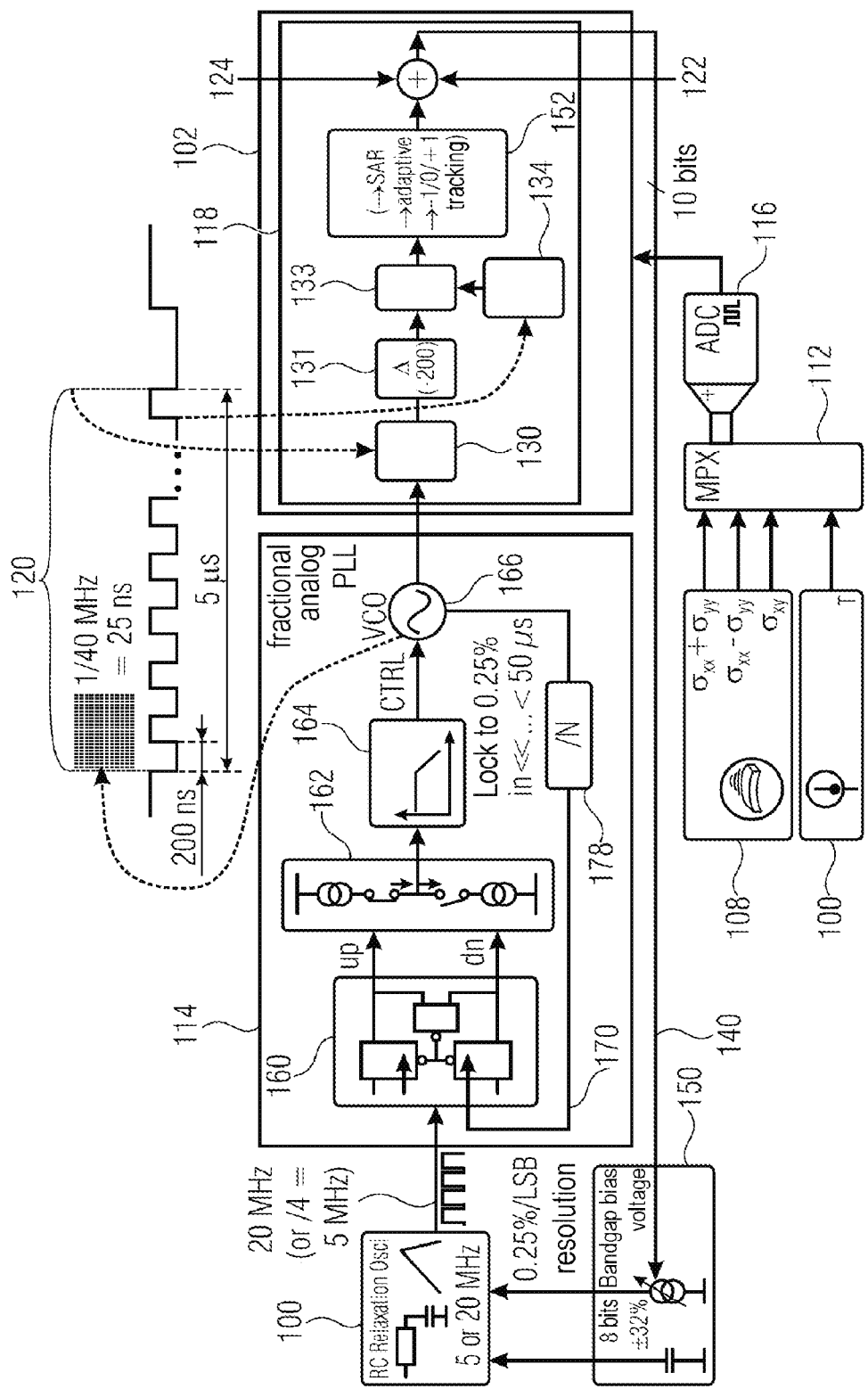
FIG. 5 shows a schematic illustration of an example of an integrated sensor circuit in which the divider ratio of a frequency divider in the feedback path of an analog phase locked loop is controlled.

FIG. 5 shows an example of a sensor circuit which is similar to the sensor circuit shown in FIG. 4, wherein identical elements are again denoted using identical reference signs and a repeated description is omitted. Reference is therefore made to the above description of FIG. 4 with regard to the description of the corresponding elements in FIG. 5. The difference between the sensor circuits shown in FIGS. 4 and 5 is that, according to FIG. 5, the analog phase locked loop 114 has a fractional frequency divider 178, that is to say a frequency divider which is able to carry out a non-integer division, as stated above. The frequency of the output signal from the analog phase locked loop 114 can therefore be adjusted by adjusting the divider ratio of the frequency divider. In the example shown in FIG. 5, the control signal 140 can therefore be alternatively or additionally designed to adjust the divisor of the frequency divider 178 in order to synchronize the output frequency of the analog phase locked loop with the frequency of the crystal oscillator of the external controller. As shown in FIG. 5, the control signal can have a greater width, for example 10 bits, than the example shown in FIG. 4 in which the control signal has a width of 8 bits. The two additional bits can be used to adjust the divider ratio of the frequency divider.

In the examples shown in FIGS. 4 and 5, the blocks 100, 108, 112, 114 and 150 can be implemented as analog circuit structures, wherein a part of the analog phase locked loop 114, namely the phase/frequency detector 160, can also be implemented by means of digital circuit structures. The block 102 is implemented by means of digital circuit structures and block 116 is an analog/digital converter having an analog input and a digital output.

Although specific examples of the analog and/or digital phase locked loops have been described above, it is clear to experts that the phase locked loops can be implemented in another manner in order to achieve the described effect, namely to lock the frequency of the output signal from the oscillator circuit of the sensor circuit to the frequency of the crystal oscillator of the external control circuit.

In the examples described, the synchronization signal has a pulse sequence of a predetermined duration. In other examples, the synchronization signal can have a different pattern. The synchronization signal can start with a first edge in each case after a signal pause on the interface, via which the synchronization signal is received, with the result that the start of the synchronization signal can be detected by the counter in order to start counting in response thereto. In other examples, the synchronization signal can have a predetermined frequency. The digital phase locked loop can be designed to detect the synchronization signal, to capture the predetermined frequency of the synchronization signal and to adjust the frequency of the oscillator circuit having the on-chip oscillator to the predetermined frequency.

Examples of the present disclosure have an analog phase locked loop in order to multiply the frequency of the output signal from an on-chip oscillator. In examples, the output signal from the on-chip oscillator can therefore be generated with a lower and therefore more stable frequency. Synchronization with an external initial pattern can take place using digital processing, in which case it is also possible to store compensation values which can be used to compensate for temperature differences and stress.

Examples of the present disclosure provide a sensor circuit having a pre-compensated on-chip oscillator which is synchronized with an external interface. Examples use the precision-oscillator-based time accuracy which is provided by an external microprocessor, μP, that is to say an external controller, in order to increase the accuracy of the on-chip oscillator in the sensor circuit and to stabilize its frequency over the temperature and aging effects. This makes it possible for the sensor circuit to recognize radio-frequency patterns on the external interface and to transmit them via the external interface.

Examples of the disclosure can be used for any desired sensor circuits, for example angle sensors or current sensors, which transmit their captured values to an external controller. In addition to the temperature sensors and/or stress sensors, examples of sensor circuits can therefore have angle sensors and/or current sensors, wherein the integrated circuit is designed to transmit the output signals from these sensors to an external controller via an interface, for example the interface 32 in FIG. 2.

In examples of the disclosure, the interfaces of the sensor circuit and/or of the external controller are Bluetooth interfaces. In the case of such interfaces, it is necessary to comply with a high degree of accuracy of the sleep clocks for Bluetooth low-energy devices, to which a connection is intended to be established and maintained. For example, it is necessary to comply with a sleep clock accuracy of ±500 ppm. Examples of the present disclosure enable such accuracy by virtue of the procedure described herein. In examples of the disclosure, the interfaces are UART interfaces, in which case the procedure described herein on the sensor side enables a precise clock in order to transmit and receive radio-frequency signal patterns.

In examples, the external controller is designed to transmit the synchronization signal to the integrated circuit at very large intervals of time. In examples of the disclosure, the external controller is designed to not transmit the synchronization signal to the integrated circuit more often than once a day. This is possible since the oscillator circuit is pre-compensated, namely using the captured environmental parameter(s) and the stored compensation parameters.

Figure 6:
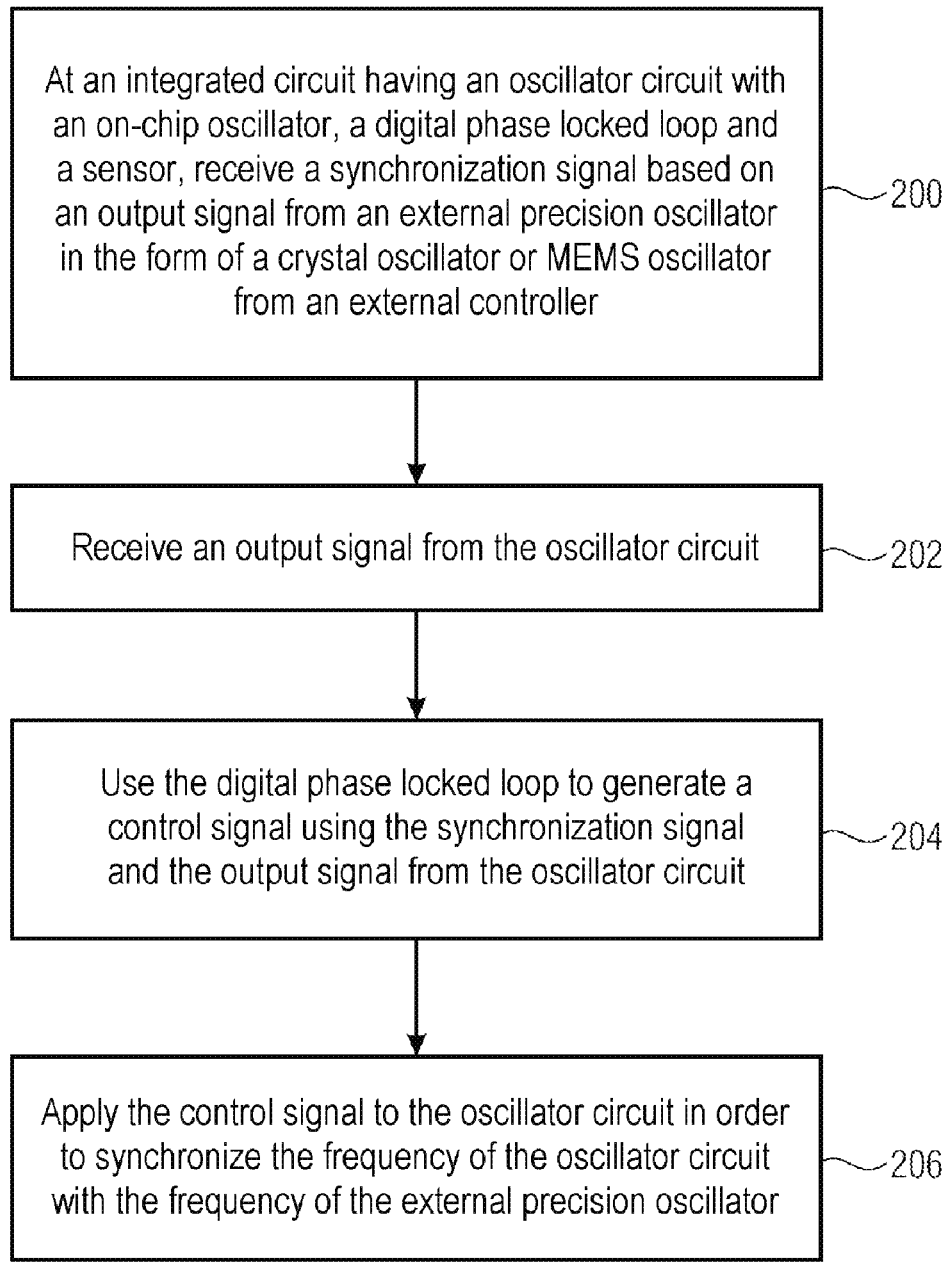
FIG. 6 shows a flowchart of a method according to an example of the present disclosure.

FIG. 6 shows a flowchart of an example of a method synchronizing an oscillator circuit of an integrated circuit having an oscillator circuit of adjustable frequency, a digital phase locked loop and a sensor for measuring an environmental parameter. The oscillator circuit has an on-chip oscillator. In 200, a synchronization signal based on an output signal from an external precision oscillator in the form of a crystal oscillator or MEMS oscillator is received from an external controller. In 202, an output signal from the oscillator circuit is received. In 204, a control signal for the oscillator circuit is generated by means of the digital phase locked loop using the synchronization signal and the output signal from the oscillator circuit. In 206, the control signal is applied to the oscillator circuit in order to synchronize the frequency of the oscillator circuit with the frequency of the external precision oscillator. In other words, the frequency of the oscillator circuit is regulated to the frequency of the external precision oscillator.

In examples, the method also comprises multiplying the frequency of an output signal from the on-chip oscillator by means of a frequency multiplier in order to generate the output signal from the oscillator circuit as a multiple of the frequency of the on-chip oscillator. In examples, the synchronization signal has a pattern of a predetermined duration, wherein a number of oscillations in the output signal from the oscillator circuit is counted during the predetermined duration and the control signal is generated on the basis of the counting result in order to bring the number to a predetermined value. In examples, the synchronization signal has a predetermined frequency, to which the frequency of the oscillator circuit is adjusted.

In examples, at least one environmental parameter is measured in the method, wherein the at least one measured environmental parameter is taken into account when generating the control signal, wherein the at least one measured environmental parameter has a temperature and/or a mechanical stress. In examples, compensation parameters for taking into account process variations in the production of the integrated circuit are taken into account when generating the control signal. In examples, compensation parameters are stored in a memory, wherein the memory is accessed using the at least one measured environmental parameter in order to obtain at least one compensation parameter which is taken into account when generating the control signal. In examples, the method comprises adjusting a resistance of the on-chip oscillator, a capacitance of the on-chip oscillator, a comparator reference voltage of the on-chip oscillator and/or a current of the on-chip oscillator using the control signal in order to adjust the frequency of the oscillator circuit. In examples, the method comprises adjusting a divider ratio of a frequency divider of a frequency multiplier using the control signal. In examples, the method comprises transmitting the synchronization signal from the external controller to the integrated circuit according to a synchronization protocol, wherein the synchronization protocol specifies that the synchronization signal is transmitted to the integrated circuit periodically with a particular regularity and/or in each case after the integrated circuit has been switched on. In examples, the method comprises transmitting sensor signals to the external controller with a first regularity, wherein the synchronization protocol specifies that the synchronization signal is transmitted to the integrated circuit with a second regularity which is lower than the first regularity, wherein a ratio of the first regularity to the second regularity is at least 10:1, at least 50:1 or at least 100:1.

In examples, the circuits and circuit structures described herein can be implemented by means of any desired suitable circuit structures, for example microprocessor circuits, ASIC circuits, CMOS circuits and the like. In examples, circuits and circuit structures, for example processing circuits and phase locked loops, can be implemented as a combination of hardware structures and machine-readable instructions. For example, circuits and circuit structures may have a processor and storage devices which store machine-readable instructions which result in methods described herein being carried out when they are executed by the processor.

Although some aspects of the present disclosure have been described as features in connection with an apparatus, it is clear that such a description can likewise be considered to be a description of corresponding method features. Although some aspects have been described as features in connection with a method, it is clear that such a description can also be considered to be a description of corresponding features of an apparatus or of the functionality of an apparatus.

In the detailed description above, different features were sometimes grouped together in examples in order to streamline the disclosure. This type of disclosure is not intended to be interpreted as the intention that the claimed examples have more features than expressly indicated in each claim. Rather, as described by the following claims, the subject matter may reside in fewer than all features of an individual disclosed example. Consequently, the following claims are hereby included in the detailed description, in which case each claim can signify a dedicated separate example. Whereas each claim can signify a dedicated separate example, it is noted that, although dependent claims in the claims refer back to a specific combination with one or more other claims, other examples also comprise a combination of dependent claims with the subject matter of any other dependent claim or a combination of any feature with other dependent or independent claims. Such combinations shall be included unless it is stated that a specific combination is not intended. Furthermore, the intention is for a combination of features of a claim with any other independent claim to also be included even if this claim is not directly dependent on the independent claim.

The examples described above are only representative of the principles of the present disclosure. It should be understood that modifications and variations of the arrangements and of the described details are obvious to experts. The intention is therefore for the disclosure to be limited only by the accompanying patent claims and not by the specific details stated for the purpose of describing and explaining the examples.

LIST OF REFERENCE SIGNS

10 Integrated sensor circuit
12 Oscillator circuit
14 Digital phase locked loop
16 Sensor
18 On-chip oscillator
20 Input
22 External interface
24 Output
30 External controller
32, 34 Interfaces
36 Data signals
38 External precision oscillator
40 Processing circuit
100 On-chip oscillator
102 Digital processing circuit
104 Interface
106 Memory
108 Stress sensors
110 Temperature sensor
112 Multiplexer
114 Analog phase locked loop
116 Analog/digital converter
118 Digital phase locked loop
120 Synchronization signal
122 Stress and temperature compensation parameter
124 Process variation compensation parameter
130 Counter
131 Difference block
132 Starting value memory
133 Latch block
134 Pattern recognition circuit
136 Tracking logic unit
138 Adder
140 Control signal
150 Supply circuit
152 Tracking logic unit
160 Phase/frequency detector
162 Charge pump
164 Loop filter
166 Voltage-controlled oscillator
168 Integer frequency divider
170 Feedback signal
178 Fractional frequency divider

What is claimed is:

1. An integrated circuit, comprising:
an oscillator circuit comprising an on-chip oscillator, wherein a frequency of an output signal from the oscillator circuit is adjustable;
a digital phase locked loop comprising an input, an external interface, and an output, wherein the digital phase locked loop is configured to receive the output signal from the oscillator circuit at the input, to receive a synchronization signal based on an output signal from an external precision oscillator at the external interface, to generate a control signal at the output, and to output the control signal to the oscillator circuit in order to synchronize the frequency of the output signal with a frequency of the external crystal oscillator, wherein the external precision oscillator is a crystal oscillator or a micro-electromechanical system (MEMS) oscillator; and
at least one sensor configured to measure at least one environmental parameter, wherein the digital phase locked loop is configured to generate the control signal based on the at least one measured environmental parameter.

2. The integrated circuit as claimed in claim 1, wherein the oscillator circuit includes a frequency multiplier that is coupled to an output of the on-chip oscillator and is configured to output the output signal from the oscillator circuit at an output of the frequency multiplier.

3. The integrated circuit as claimed in claim 2, wherein the frequency multiplier includes an analog phase locked loop.

4. The integrated circuit as claimed in claim 1, wherein:
the synchronization signal has a pattern of a predetermined duration, wherein the digital phase locked loop is configured to count a number of oscillations in the output signal from the oscillator circuit during the predetermined duration and generate the control signal based on the counted number of oscillations in order to bring the number of oscillations in the output signal to a predetermined value, or
the synchronization signal has a predetermined frequency and the digital phase locked loop is configured to adjust the frequency of the output signal to the predetermined frequency.

5. The integrated circuit as claimed in claim 1, wherein the on-chip oscillator is a relaxation oscillator or an LC oscillator.

6. The integrated circuit as claimed in claim 1, further comprising:
a memory that stores compensation parameters, wherein the memory is accessed using the at least one measured environmental parameter in order to obtain at least one compensation parameter therefrom, and
wherein the digital phase locked loop is configured to generate the control signal based on the at least one compensation parameter.

7. The integrated circuit as claimed in claim 1, wherein the at least one sensor includes at least one of a temperature sensor and a stress sensor.

8. The integrated circuit as claimed in claim 1, wherein the digital phase locked loop is configured to take into account compensation parameters for taking into account process variations in a production of the integrated circuit when generating the control signal.

9. The integrated circuit as claimed in claim 1, wherein the oscillator circuit is configured to adjust at least one of a resistance of the on-chip oscillator, a capacitance of the on-chip oscillator, a comparator reference voltage of the on-chip oscillator, and a current of the on-chip oscillator using the control signal in order to adjust the frequency of the output signal.

10. The integrated circuit as claimed in claim 3, wherein the analog phase locked loop has a frequency divider in a feedback path thereof, wherein the oscillator circuit is configured to adjust a divider ratio of the frequency divider using the control signal.

11. The integrated circuit as claimed in claim 1, wherein:
the digital phase locked loop is configured to synchronize the frequency of the output signal with the frequency of the external precision oscillator in response to each time receiving the synchronization signal, and
the synchronization signal is part of a synchronization protocol that specifies that the synchronization signal is respectively transmitted to the integrated circuit periodically after a predetermined duration and in each case after the integrated circuit has been switched on.

12. The integrated circuit as claimed in claim 11, wherein:
the integrated circuit is configured to transmit sensor signals generated by the at least one sensor to an external controller with a first regularity, the sensor signals being representative of the at least one measured environmental parameter, and
the synchronization protocol specifies that the synchronization signal is transmitted to the integrated circuit with a second regularity that is lower than the first regularity, wherein a ratio of the first regularity to the second regularity is at least 10:1, at least 50:1, or at least 100:1.

13. A sensor system, comprising:
an integrated circuit comprising:
an oscillator circuit comprising an on-chip oscillator, wherein a frequency of an output signal from the oscillator circuit is adjustable;
a digital phase locked loop comprising an input, an external interface, and an output, wherein the digital phase locked loop is configured to receive the output signal from the oscillator circuit at the input, to receive a synchronization signal based on an output signal from an external precision oscillator at the external interface, to generate a control signal at the output, and to output the control signal to the oscillator circuit in order to synchronize the frequency of the output signal with a frequency of the external crystal oscillator, wherein the external precision oscillator is a crystal oscillator or a micro-electromechanical system (MEMS) oscillator; and
at least one sensor configured to measure at least one environmental parameter, wherein the digital phase locked loop is configured to generate the control signal based on the at least one measured environmental parameter; and
an external controller configured to output the synchronization signal to the integrated circuit.

14. The sensor system as claimed in claim 13, wherein the external controller is configured to output the synchronization signal as part of a synchronization protocol, wherein the synchronization protocol specifies that the synchronization signal is transmitted to the integrated circuit periodically with a particular regularity and in each case after the integrated circuit has been switched on.

15. The sensor system as claimed in claim 14, wherein the external controller is configured to receive sensor signals representative of the at least one measured environmental parameter from the integrated circuit with a first regularity, wherein the synchronization protocol specifies that the synchronization signal is transmitted to the integrated circuit with a second regularity that is lower than the first regularity, wherein a ratio of the first regularity to the second regularity is at least 10:1, at least 50:1 or at least 100:1.

16. A controller, comprising:
an interface that is configured to receive sensor signals from an external integrated circuit with a first regularity and to output synchronization signals based on an output signal from a precision oscillator to the external integrated circuit, wherein the precision oscillator is a crystal oscillator or a micro-electromechanical system (MEMS) oscillator; and
a processing circuit that is configured to output the synchronization signals to the external integrated circuit according to a synchronization protocol, wherein the synchronization protocol specifies that the synchronization signal is transmitted to the integrated circuit with a second regularity that is lower than the first regularity, wherein a ratio of the first regularity to the second regularity is at least 10:1, at least 50:1 or at least 100:1.

17. A method for synchronizing an oscillator circuit of an integrated circuit that comprises an oscillator circuit of adjustable frequency, a digital phase locked loop, and at least one sensor configured to measure at least one environmental parameter, wherein the oscillator circuit comprises an on-chip oscillator, the method comprising:
receiving a synchronization signal from an external controller, wherein the synchronization signal is based on an output signal from an external precision oscillator, and the external precision oscillator is a crystal oscillator or a micro-electromechanical system (MEMS) oscillator;
receiving an output signal from the oscillator circuit;
using the digital phase locked loop to generate a control signal using the synchronization signal and the output signal from the oscillator circuit; and
applying the control signal to the oscillator circuit in order to synchronize the adjustable frequency of the oscillator circuit with a frequency of the external precision oscillator.

18. The method as claimed in claim 17, further comprising:
multiplying a frequency of an output signal of the on-chip oscillator by a frequency multiplier in order to generate the output signal of the oscillator circuit.

19. The method as claimed in claim 17, wherein:
the synchronization signal has a pattern of a predetermined duration, wherein a number of oscillations in the output signal from the oscillator circuit is counted during the predetermined duration and the control signal is generated based on the counted number of oscillations in order to bring the number of oscillations in the output signal to a predetermined value, or
the synchronization signal has a predetermined frequency to which the frequency of the oscillator circuit is adjusted.

20. The method as claimed in claim 17, further comprising:
generating the control signal based on the at least one measured environmental parameter, wherein the at least one measured environmental parameter includes at least one of a temperature and a mechanical stress, or
generating the control signal based on compensation parameters that take into account process variations in a production of the integrated circuit.

21. The method as claimed in claim 20, wherein the compensation parameters are stored in a memory, wherein the memory is accessed using the at least one measured environmental parameter in order to obtain at least one compensation parameter that is taken into account when generating the control signal.

22. The method as claimed in claim 17, further comprising:
adjusting at least one of a resistance of the on-chip oscillator, a capacitance of the on-chip oscillator, a comparator reference voltage of the on-chip oscillator, or a current of the on-chip oscillator using the control signal in order to adjust the frequency of the oscillator circuit.

23. The method as claimed in claim 18, further comprising:
adjusting a divider ratio of a frequency divider of the frequency multiplier using the control signal.

24. The method as claimed in claim 17, further comprising:
transmitting the synchronization signal from the external controller to the integrated circuit according to a synchronization protocol, wherein the synchronization protocol specifies that the synchronization signal is transmitted to the integrated circuit periodically with a particular regularity and in each case after the integrated circuit has been switched on.

25. The method as claimed in claim 24, further comprising:
transmitting sensor signals representative of the at least one measured environmental parameter to the external controller with a first regularity, wherein the synchronization protocol specifies that the synchronization signal is transmitted to the integrated circuit with a second regularity which is lower than the first regularity, wherein a ratio of the first regularity to the second regularity is at least 10:1, at least 50:1 or at least 100:1.

* * * * *